US008877641B2

(12) United States Patent
Gabriel

(10) Patent No.: US 8,877,641 B2
(45) Date of Patent: Nov. 4, 2014

(54) LINE-EDGE ROUGHNESS IMPROVEMENT FOR SMALL PITCHES

(75) Inventor: Calvin T Gabriel, Cupertino, CA (US)

(73) Assignee: Spansion LLC, Sunnyvale, CA (US)

(*) Notice: Subject to any disclaimer, the term of this patent is extended or adjusted under 35 U.S.C. 154(b) by 590 days.

(21) Appl. No.: 12/648,059

(22) Filed: Dec. 28, 2009

(65) Prior Publication Data
US 2011/0159699 A1 Jun. 30, 2011

(51) Int. Cl.
*H01L 21/302* (2006.01)
*H01L 21/311* (2006.01)
*H01L 21/768* (2006.01)

(52) U.S. Cl.
CPC .... H01L 21/31144 (2013.01); H01L 21/76802 (2013.01); H01L 21/31116 (2013.01)
USPC ............. 438/689; 438/690; 438/725; 216/37; 430/315; 430/324; 430/326; 430/328; 430/330

(58) Field of Classification Search
USPC ............. 438/689, 690, 725; 216/37; 430/315, 430/324, 325, 326
See application file for complete search history.

(56) References Cited

U.S. PATENT DOCUMENTS

| 6,627,388 | B2 * | 9/2003 | Lin et al. ........................ 430/315 |
| 7,998,872 | B2 * | 8/2011 | Luong et al. .................. 438/717 |
| 2005/0277289 | A1 * | 12/2005 | Wagganer et al. ............ 438/637 |
| 2006/0205223 | A1 * | 9/2006 | Smayling ...................... 438/725 |
| 2010/0015809 | A1 * | 1/2010 | Adams et al. ................. 438/711 |
| 2010/0105213 | A1 * | 4/2010 | Ishikawa et al. ............. 438/717 |

OTHER PUBLICATIONS

S.Wolf, Silicon Processing for the VLSI Era, vol. 1, (Lattice Press), (1986), pp. 523-526.*

* cited by examiner

*Primary Examiner* — Duy Deo
*Assistant Examiner* — Maki Angadi

(57) ABSTRACT

A method for mitigating line-edge roughness on a semiconductor device. The method includes line-edge roughness mitigation techniques in accordance with embodiments of the present invention. The techniques include: reducing the SiON film thickness below a conventional thickness; increasing the photoresist thickness above a conventional thickness; etching the SiON film with an etch bias power less than a conventional wattage amount with an overetch percentage less than a conventional overetch percentage; removing the SiON film layer immediately after completion of the amorphous carbon film layer etching; and lowering the lower electrode temperature below a conventional temperature.

18 Claims, 14 Drawing Sheets

LINE-EDGE ROUGHNESS IMPROVEMENT FOR SMALL PITCHES

TECHNICAL FIELD

The present invention relates generally to semiconductor substrate processing. More particularly to reducing line-edge roughness seen along line edges of trenches and other structures formed in semiconductor devices.

BACKGROUND

Efforts of the semiconductor fabricating industry to produce continuing improvements in miniaturization and packing densities has seen improvements and new challenges to the semiconductor fabricating process. One example semiconductor process experiencing tremendous improvements in miniaturization and packing densities is ultra-violet lithography. Making use of the pattern transfer ability of photoresist materials formed into patterns through lithography exposure and developing, semiconductor pitch sizes have fallen steadily. Today lithography techniques patterning with 193 nanometer (nm) Argon Fluoride (ArF) photoresists are enabling process technologies to reach pitch structures as small as 43 nm and 32 nm NAND. The "pitch" of a semiconductor structure is a common measurement of the technological generation of a semiconductor chip. It refers to a hypothetical distance between structures in a semiconductor substrate.

With the use of ArF photoresist in ultra violet lithography and pitch sizes dropping below 100 nm, the phenomenon of line-edge roughness is now a serious problem. As illustrated in FIGS. 1A, 1B, and 2, the ideal, smooth lines seen in the hypothetical resist lines of FIG. 1A are distorted by irregularities seen in FIG. 1B. While not drawn to scale and exaggerated for clarity, the irregularities in FIG. 1B serve to illustrate how imperfections and defects in the photoresist may produce ripples and uneven line edges in trenches and other structures formed during the plasma etching process, as illustrated in FIG. 2. What would have been a tolerable amount of line-edge roughness in larger pitch structures produces unacceptable defects in tighter pitch structures below 100 nm as discussed below. FIG. 2, a cross-section of FIG. 1B, also not drawn to scale and exaggerated, illustrates the irregularities 202 of the photoresist 204 transferring to the line edges 206 of trenches and other structures etched into the underlying layers, producing undesirable irregularities in the resulting line edges 206. Line edge roughness in the x-y direction as shown in FIG. 1B may translate straight downward and manifest itself as variations in line width as illustrated in FIG. 2. For example, line 208 is narrower than the other lines at the cross-section point while line 210 is wider than the other lines at the cross-section point. This difference in line width at the cross-section point is caused by the line ripples illustrated in FIG. 1B, translated straight downward. As discussed further below, these resulting irregularities in semiconductor structures are measured according to an average line-edge roughness and/or line-width roughness.

The use of ArF photoresist in ultra violet lithography exacerbates the problem of line-edge roughness. Ultra violet photoresist is especially sensitive to the plasma etching applied to the underlying semiconductor substrate structures. Ultra violet photoresist's sensitivity to plasma causes distortions in the resist line as the etching process continues, and therefore, forming the line edges of trenches and other structures underneath the photoresist with distortions transferred from the photoresist.

Photoresist is not a uniform material; it contains "lumps" of polymer aggregates that have become a concern especially now that resist lines are fine enough that atomic effects may be seen. When atomic effects begin to play a part in the quality of line edges, the clusters of polymers that may form in the photoresist now lead to deformities that may be seen in tight line edges. Therefore, when a line is developed in the photoresist, little ripples in the line edge begin to form due to the hard and soft places in the photoresist. Rather than a homogenous material, photoresist is an aggregate of multiple materials, and as the photoresist is etched, the plasma (which is a mixture of ions and neutrals) hitting the wafer causes chemical reactions and raises the temperature of the photoresist and the wafer. The softer areas of the photoresist are more easily etched away, leaving behind rough and potentially uneven harder areas of the photoresist. As the etching process continues, the polymer formations in the aggregate photoresist are revealed. The plasma etching process further distorts the photoresist by heating it and changing its chemical components, causing a stress change in the resist. The lines patterned in the photoresist react to that stress change resulting in a buckling of the photoresist, with all of these affects becoming more visible and problematic as pitch sizes shrink with each technological generation. In other words, while these effects were always present in previous generations, pitch sizes below 100 nm are more sensitive to these photoresist irregularities.

With 193 nm ArF photoresist, lines are developed extremely close together, requiring low wavelength, high frequency light (193 nm). To ensure that such a short wavelength gets into the resist to pattern it, the resist must be made very thin. However, the photoresist thickness is the mask for the etching process. A thin resist is more easily patterned, but is also more vulnerable to the damaging effects of etching. Further, the etching process itself reduces the photoresist mask during etching. Eventually as aggregates are exposed along the resist line edge, a ripple on the line edge of the photoresist may be passed on to the underlying films during etching.

This line edge rippling can result in breaks in the copper lines eventually formed in the etched trenches of 43 nm NAND. When this technology is applied to structures as small as 43 nm NAND, the present line-edge roughness is now visible as ripples in the line edges. The end result is devices that don't work. In other words, any problems with roughness that had existed in past generations have been greatly magnified by going down to 43 nm NAND. The increased line-edge roughness results in whole chips that don't work because of roughness causing crude defects such as shorts and breaks in the copper lines formed in the trenches etched through the patterned resist lines.

Another associated effect with line-edge roughness that is also increasingly seen in 43 nm NAND fabrication is line wiggling. As seen in FIG. 3, the lines have moved into a wiggling pattern as opposed to the expected straight lines of FIG. 1A. A physical stress has produced this "wiggling" in the etched lines or trenches. It isn't just that there are polymer aggregates that are revealed at the edge as seen in line-edge roughness—here there's some added stress. There is some inherent stress in the photoresist, but as described above, the polymer aggregates change when they are heated up, becoming different from the surrounding material. As the underlying layers or films are etched through the photoresist pattern, material from the etching is implanted into the underlying films from the etching process. Further, with each etch, a different film under the film currently being etched is revealed. Each film revealed has different stresses and as they are each etched their stresses are mismatched with the layer above, each mismatched stress contributing to the characteristic wiggle as seen in FIG. 3.

Until recently, the standard approach (e.g., adding pattern transfer layers and reducing etching power) to reduce line-edge roughness was to varying degrees at least adequate for pitches greater than 100 nm. However, with pitches smaller than 100 nm, even low levels of line-edge roughness are producing unacceptable results and new solutions are needed.

SUMMARY OF THE INVENTION

This present invention provides a solution to the challenges inherent in dealing with line-edge roughness and line wiggling in 43 nm and smaller NAND pitch structures. While it has been determined that almost every process step and the materials chosen (i.e., selection of films, film thickness, PR thickness, PR shape, ion energy, temperature, selection of polymers, and the timing of each etch step) affect line wiggling and line-edge roughness, the organic antireflective coating/silicon oxynitride (oARC/SiON) film sandwich between a photoresist and a pattern transfer layer have been identified as the most critical films. Several techniques have been identified to mitigate the extent of line-edge roughness produced during plasma etching. These techniques are aimed at reducing film stress differences as well as the extent of the attack on or distortion of the photoresist by the plasma etching itself.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention.

This present invention provides a solution to the increasing challenges inherent in dealing with line-edge roughness and line wiggling in small pitches, such as 43 nm (or smaller) NAND. While it has been determined that almost every process step and the materials chosen (e.g., the selection of films, film thickness, photoresist thickness, photoresist shape, ion energy, temperature, selection of polymers, and the timing of each etch step) affect line wiggling and line-edge roughness, an organic antireflective coating/silicon oxynitride (ARC/SiON) film stack or sandwich between a photoresist and a pattern transfer layer have been identified as the most critical films. Several techniques have been identified to mitigate the extent of line-edge roughness produced during plasma etching. These techniques are aimed at reducing film stress differences (which contribute to film buckling and line wiggling) as well as the extent of the attack on or distortion of the photoresist by the plasma etching itself. These techniques include: an optimum SiON film thickness; an optimum photoresist thickness; etching the oARC/SiON films with optimum RF power and optimum overetch percentage; removing the SiON film immediately after amorphous carbon etching; and reducing lower electrode temperatures to reduce both top and bottom line-width roughness.

These techniques used in combination will help to reduce the line-edge roughness to prevent the described defects from appearing in semiconductor wafers during the fabrication process. While there will always be a minimum amount of roughness that is not subject to process improvements due to the raw roughness inherent in each particular photoresist (i.e., the noise level of the photoresist), the process steps provided herein should reduce the extent of induced line-edge roughness added to that quantity of roughness inherent in the photoresist.

Figure 1A:
FIG. 1A illustrates the absence of line-edge roughness in a semiconductor structure.
Figure 1B:
FIG. 1B illustrates line-edge roughness in a semiconductor structure.
Figure 2:
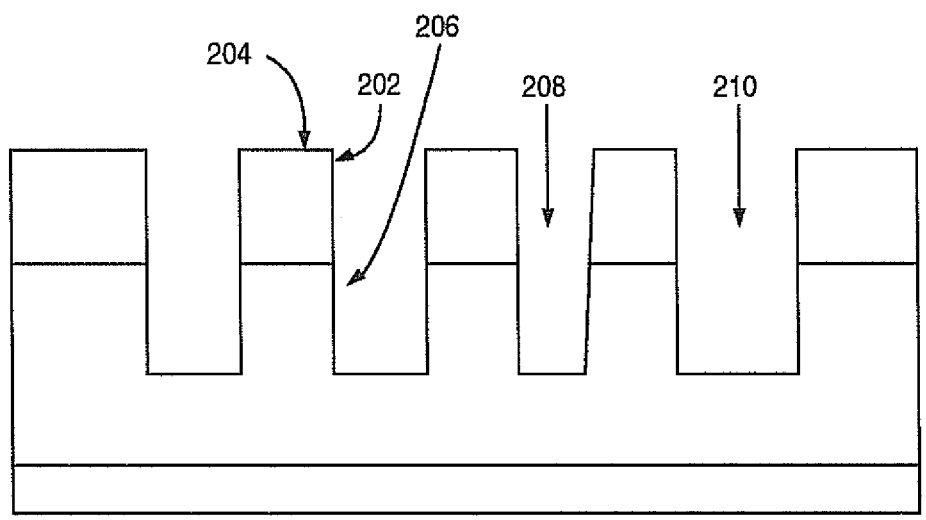
FIG. 2 illustrates a schematic cross-section of a semiconductor device according to the prior art exhibiting line-width roughness.
Figure 3:
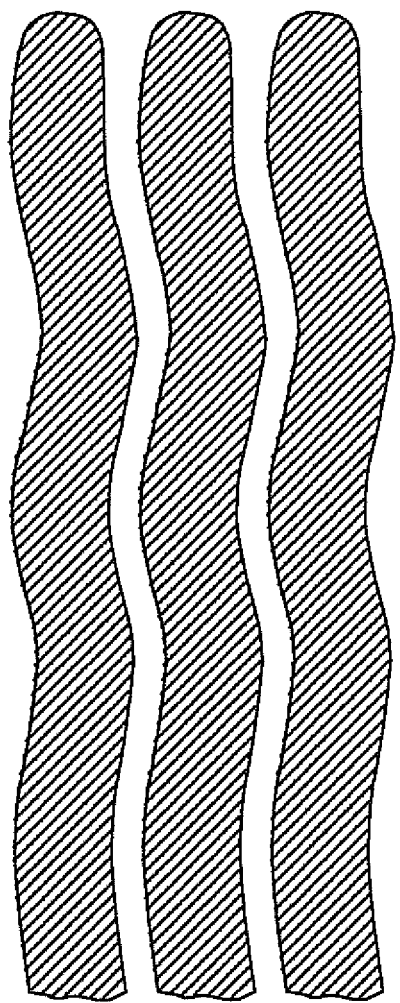
FIG. 3 illustrates line wiggling in a semiconductor structure according to the prior art.
Figure 4:
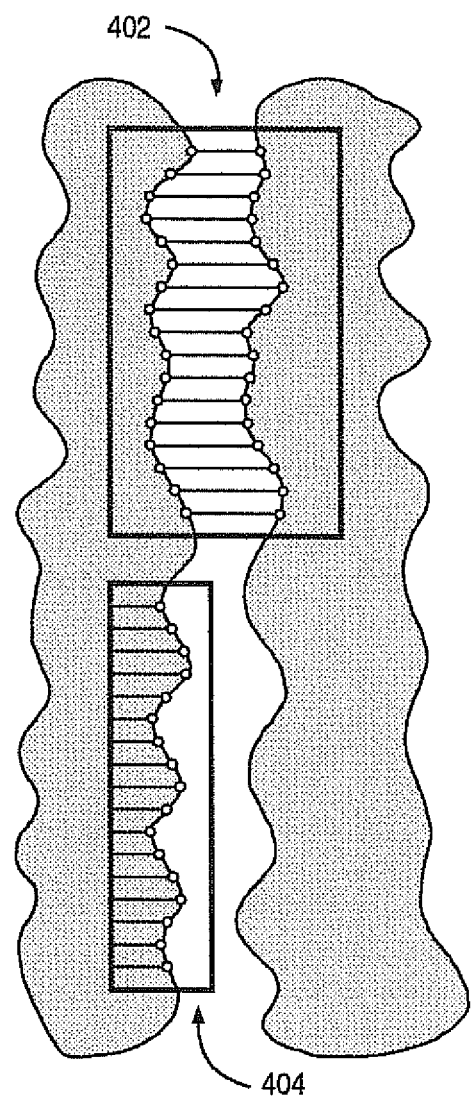
FIG. 4 illustrates CD-SEM measurement of sections of a semiconductor structure in accordance with an embodiment of the present invention.

In diagnosing the extent of line-edge roughness of a resist line, etched trench or other etched semiconductor structures, the level of line-width roughness is also determined. Variations in the width of a line and/or trench determine line-width roughness. One example method for determining this variation is by calculating the critical dimension through scanning electron microscopy (CD-SEM). As illustrated in FIG. 4, a box 402 is drawn across a resist line or trench with two straight lines. In one example embodiment, 256 lines may be drawn across, finding the line edges and the associated widths of the resist line or trench. The variation is the line-width roughness of the line. The degree of variation as illustrated in FIG. 4 is not drawn to scale and is exaggerated for purposes of illustrating line-edge roughness and line-width roughness. Taking the standard deviation of the line-width roughness 402 provides the line-edge roughness. The box 404 illustrates the line-edge roughness of a line edge of the line or trench. However, as wiggling continues to be a problem, traditional techniques using CD-SEM may fail to capture cases of severe line wiggling or line width roughness.

Because line-edge roughness and line wiggling are intertwined, fabrication process solutions must be prepared to deal with both of them. Therefore, the line-width roughness is usually the metric chosen to follow as an overall indication of present deformities exhibited as line-edge roughness and line-wiggling. Other techniques in addition to those discussed herein exist to determine line-width roughness and are equally adequate to measure the extent of irregularities manifested as line-width roughness and line wiggling. For example, other box sizes are also available as well as differing sample sizes for determining line-width roughness. Whatever the technique, the degree of line-width roughness must be adequately quantified to allow sufficient countermeasures to reduce the measured line-width roughness. Whatever the technique, it must be adequate to quantify the level of line-width roughness and/or line wiggling present in the resist line and/or trench, especially when the degree of roughness or wiggling is severe.

Figure 5B:
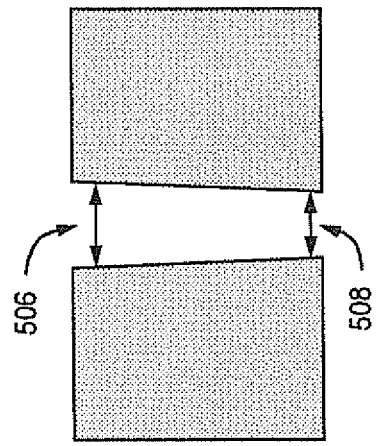
FIG. 5B illustrates a cross-section of a semiconductor structure in accordance with an embodiment of the present invention.

The CD-SEM analyzes the top and/or bottom of the line. As illustrated in an exemplary not-to-scale line etching in FIG. 5B, there may be more roughness at the top 506 as compared to the bottom 508 of the line. As the etching process continues, the pattern mask may eventually run out of material and cease being an effective mask. A bad line-edge roughness at the top 506 of the line suggests the pattern mask is running out of material. Line-width roughness at the bottom 508 of the line is affected by what the process started with (i.e., the photoresist and first layers etched). How good was the photoresist mask originally, how straight, unrippled, and how it interacted with the etching as it progressed, are all questions that affect the etching process. When the line-width roughness gets worse as the etch progresses it indicates that the etching process has hurt the layers as the etching process has etched through those layers.

Figure 5A:
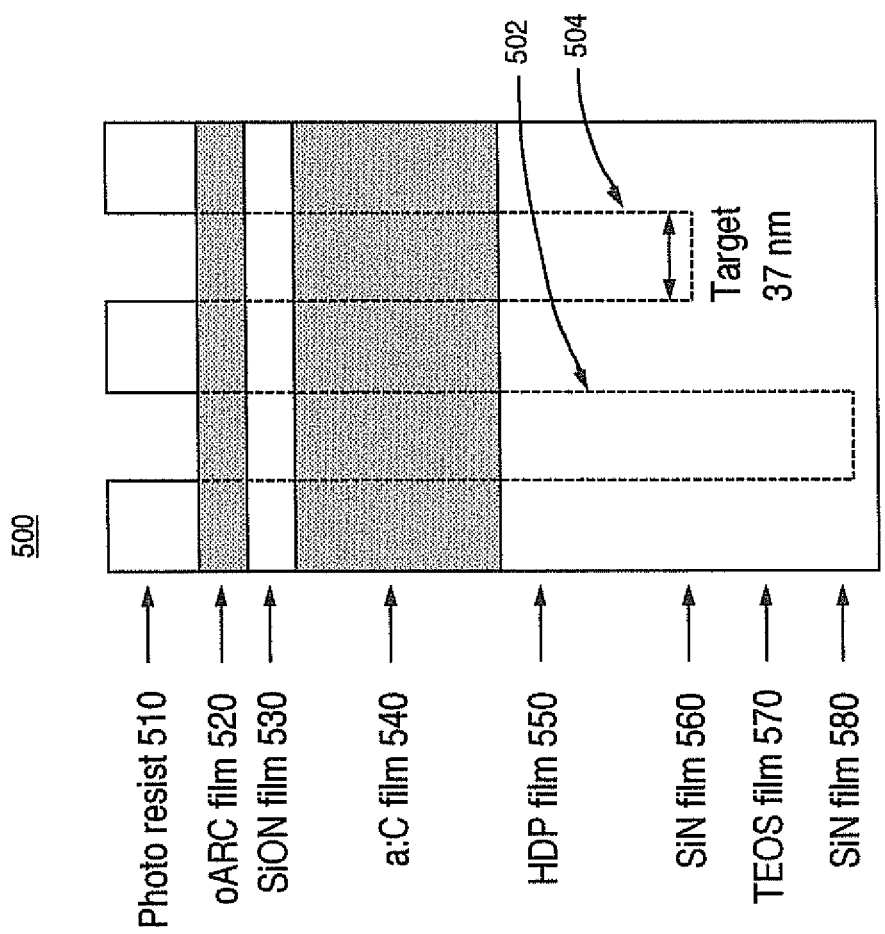
FIG. 5A illustrates a cross-section of an exemplary self-aligned dual damascene (SADD) metal 1 (M1) film stack in accordance with an embodiment of the present invention.
Figure 11:
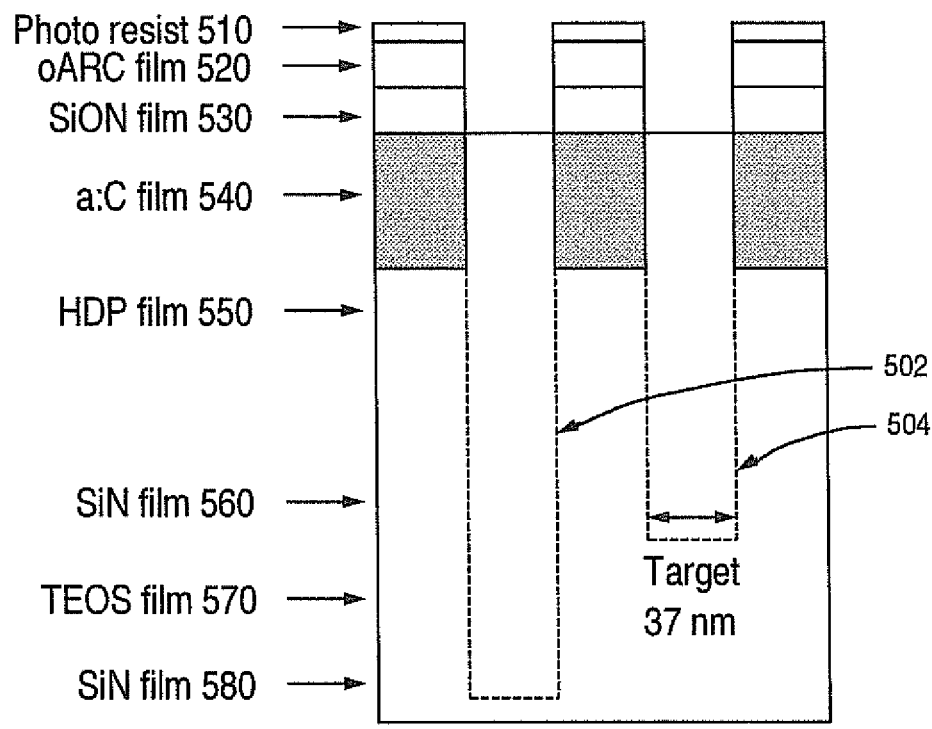
FIGS. 11-13 illustrate the steps of an example etch process of a self-aligned dual damascene (SADD) etching of a dielectric stack for forming metal-1 (M1) with 86 nm pitch in accordance with an embodiment of the present invention.
Figure 12:
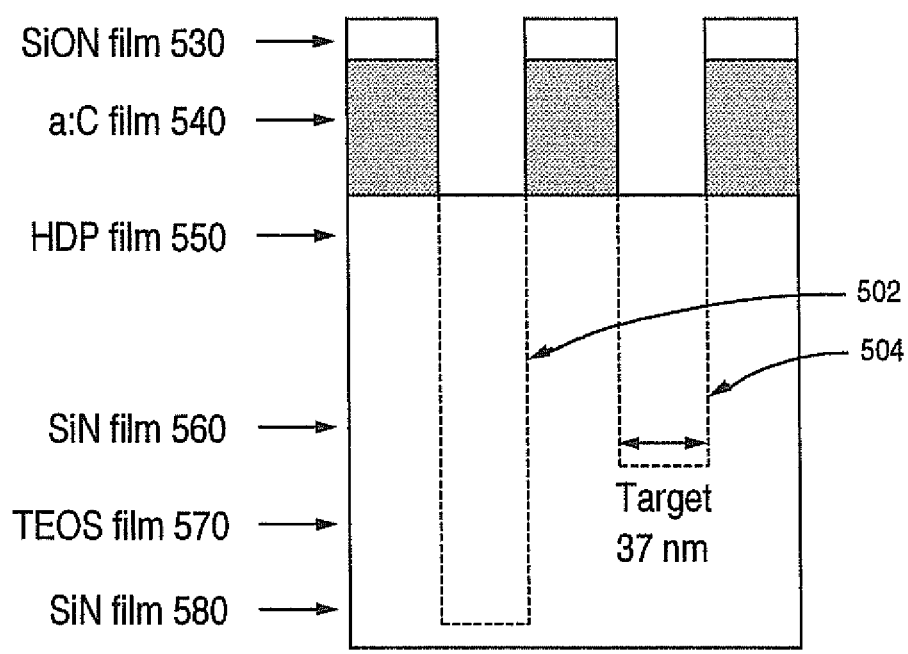
Figure 13:
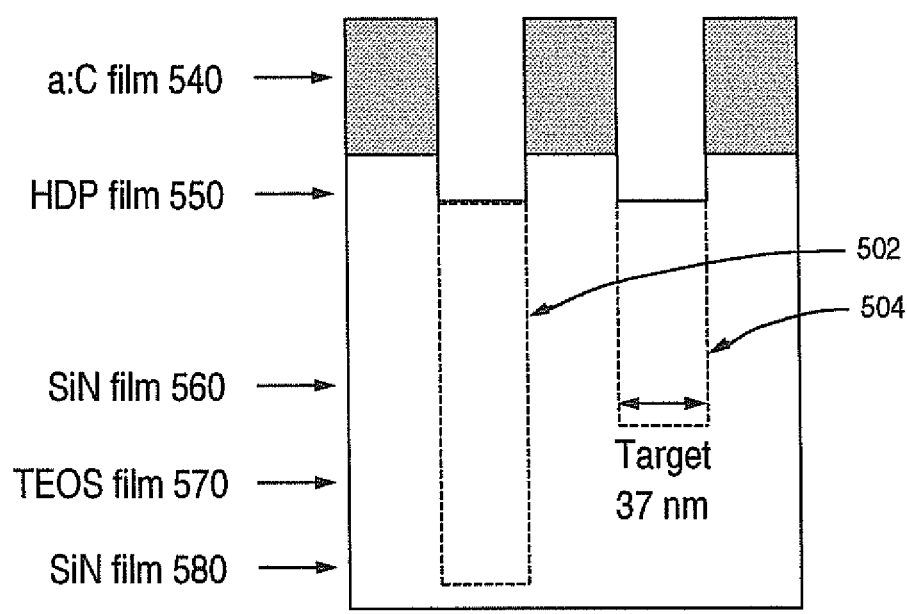

FIG. 5A and FIGS. 11-13 illustrate an example etch process of an exemplary self-aligned dual damascene (SADD) etching of a dielectric stack for forming a metal-1 (M1) film stack with 86 nm pitch. FIGS. 11-13 are discussed in detail below. FIG. 5A illustrates an example SADD M1 film stack 500 before the etching process has begun. The topmost layer, a 1150 angstroms (Å) thick photoresist 510 for immersion Argon Fluoride (ArF) lithography overlays a 340 Å thick organic antireflective coating (oARC) film 520. Below and in contact with the oARC film 520 is a 225 Å thick silicon oxynitride (SiON) film 530. The SiON film 530 overlays a 1200 Å thick amorphous carbon (a:C) film 540. The a:C film 540 overlays a 2000 Å thick high density plasma oxide (HDP) film 550, which overlays a 500 Å thick silicon nitride (SiN) film 560, which overlays a 1500 Å thick tetraethyl orthosilicate (TEOS) film 570, which lastly overlays a 300 Å thick silicon nitride film 580. The dotted-line boxes 502, 504 illustrate Vias or trenches 502, 504 to be etched into the SADD M1 dielectric film stack 500 in this exemplary embodiment. A target dimension of 37 nm at the bottom of the Via 504 in the SiN 550 film is also illustrated. In other embodiments, the vias may be replaced with etched patterns of trenches or patterned structures etched to form the components of semiconductor devices, such as NAND memory cells.

Optimal SiON Film Thickness

Figure 6:
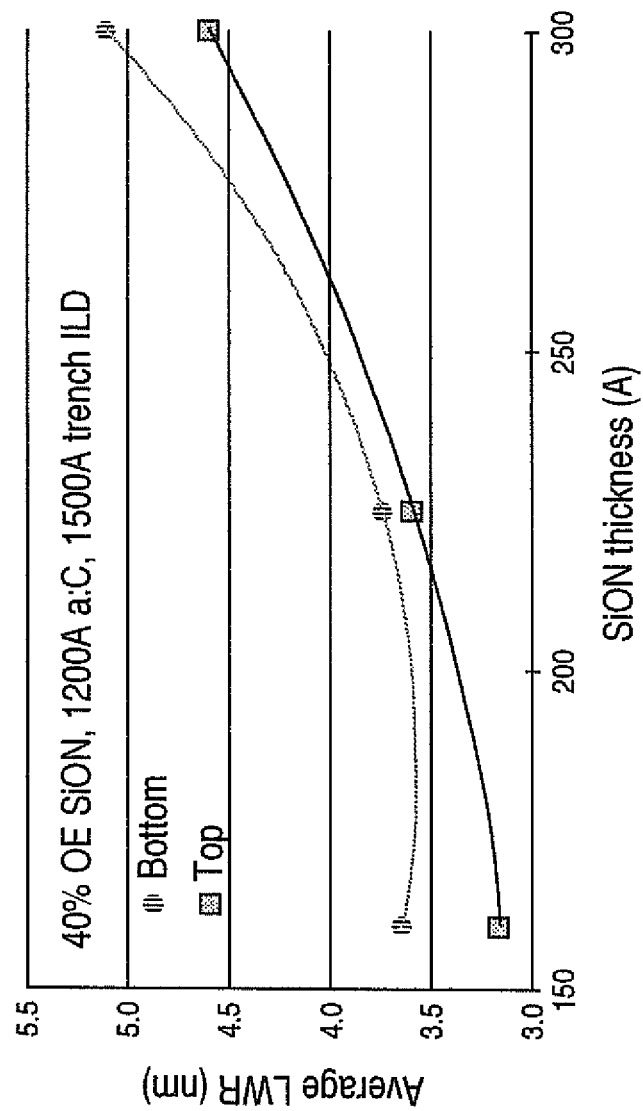
FIG. 6 is a graph illustrating SiON film thickness versus average line-width roughness in accordance with an embodiment of the present invention.

To avoid contributing additional line-edge roughness, the SiON film 530 of this embodiment has an optimum range of thicknesses. As the SiON film 530 thickness is reduced, line-edge roughness is also reduced. However, reducing the SiON film 530 thickness will only improve line-width roughness to a point. As illustrated in a graph on FIG. 6, there may be an optimum range of SiON film 530 thicknesses. SiON film 530 thicknesses below 225 Å may see a rebounding of the average line-width roughness at the bottom 508 of the line, countering any improvements seen to the average line-width roughness at the top 506 of the line. The industry standard or conventional thickness for SiON film thickness in 43 nm NAND is about 300 Å, but if the SiON film 530 thickness is reduced to a thickness less than the conventional thickness, line-edge thickness may be improved. In one embodiment, a SiON film thickness of 225 Å provides a line-width roughness at the top 406 of the line of 3.5, reduced from an average line-width roughness of 4.5 at the conventional 300 Å. Choosing a SiON film 530 thickness of 225 Å results in a 22% improvement in the average line-width roughness over current industry standards. Other embodiments may utilize SiON thicknesses less than the conventional thickness, yet greater than 225 Å. They include SiON film thickness ranges of approximately 200-250 Å. Further investigations continue to determine the value of decreasing the thickness of the SiON film below 225 Å (such as a SiON film thickness of approximately 200 Å), while attempting to control the extent of any bottom line-width roughness rebound. Seeking ever thinner SiON film thicknesses will be necessary as future generations drop below 43 nm NAND.

Optimum Photoresist Thickness

Figure 7:
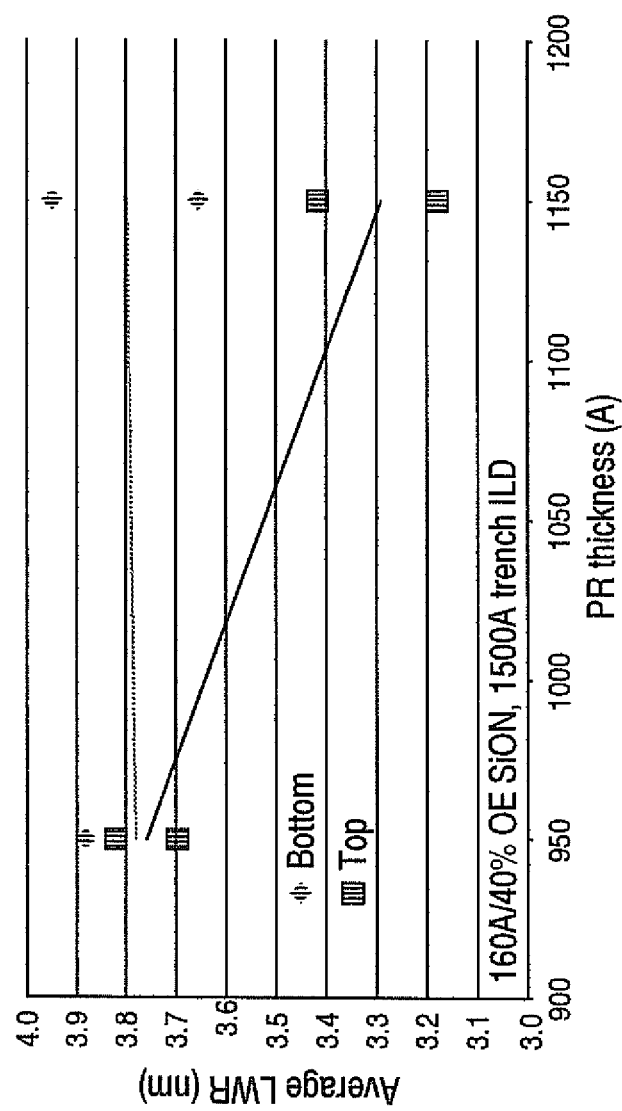
FIG. 7 is a graph illustrating photoresist thickness versus average line-width roughness in accordance with an embodiment of the present invention.

As illustrated in FIG. 7, increasing the thickness of ultra violet photoresist material decreases the average line-width roughness. However, there will be countervailing limitations to boundlessly increasing photoresist thickness. As already discussed above, reduced photoresist thicknesses are required to develop the level of detail required by small or tight pitch patterns in ultra violet lithography, especially in pitches below 100 nm using argon fluoride (ArF) photoresist. The industry standard or conventional ultra violet photoresist thickness has been 950 Å for semiconductor structures of approximately 43 nm NAND, but as illustrated in FIG. 7, adequate ultra violet photoresist patterning may be accomplished with a photoresist thickness greater than the conventional thickness. In an exemplary embodiment, the photoresist thickness was increased to approximately 1150 Å, resulting in an improvement in the average top line-width roughness. Increasing the thickness of photoresist used in 193 nm ultra violet lithography from approximately 950 Å to approximately 1150 Å saw the average top line-width roughness decrease from approximately 3.8 to 3.2. Increasing the photoresist to 1150 Å provided an almost 16% improvement in top line-width roughness. Other possible 43 nm NAND embodiments may utilize photoresist thicknesses that are also greater than the convention thickness of 950 Å, but less than 1150 Å. While other future embodiments may utilize photoresist thicknesses greater than 1150 Å.

Figure 8:
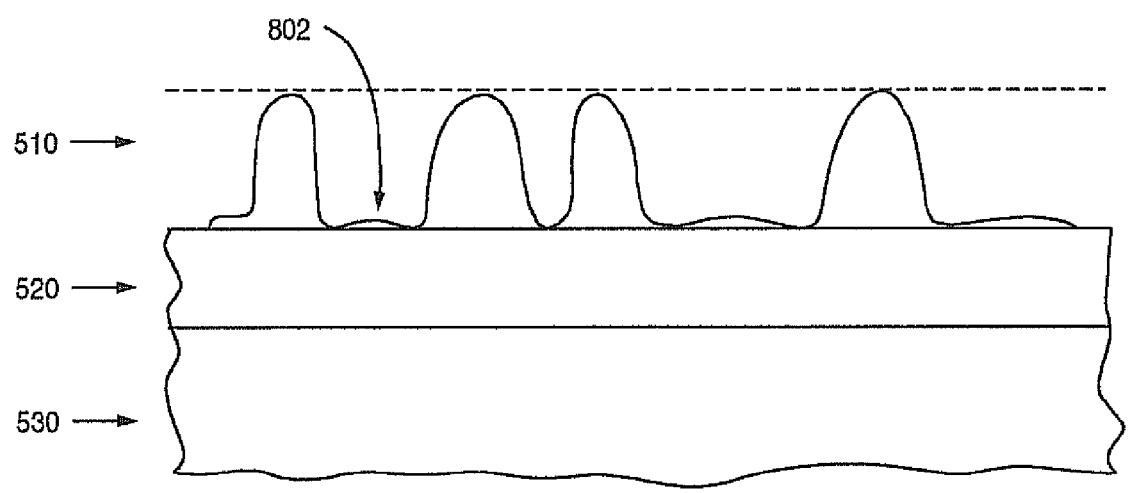
FIG. 8 illustrates a cross-section of a semiconductor structure in accordance with an embodiment of the present invention.

Etching the oARC/SiON Films with Optimal RF Power, Optimum Overetch Percentage, and the Addition of Hydrogen to the SiON Film Etch Plasma As illustrated in FIG. 8, when a pattern is formed in a photoresist material 510, such as ArF photoresist, the corners of resist lines are not sharp corners, but rather appear as "smears" at the top and bottom of such photoresist patterns, rounding the corners. Further, left over resist 510 is found in opened pattern spaces forming with the underlying oARC film 520 a scum 802 made up of oARC 520 and left over photoresist 510. The left over photoresist material or the scum 802 that it forms is most commonly seen in narrowed or tight pattern lines where the exposing ultra violet light has difficulty in reaching through the photoresist and doesn't fully expose it like it should have been, so the photoresist ends up not being fully removed from the bottom of pattern lines like expected, resulting in the presence of the scumming 802 at the bottom of tight pattern lines.

For the above reasons, as well as other fabrication processes that play a part in the etching process, there will be a resultant non-uniformity in the etch depth. The etching process includes endpoints that stop the etching process when a particular film layer has been etched through, or when a particular etch depth has been reached. However, even when a particular endpoint has been reached, overetching is required to remove the non-uniformities caused by the presence of scum 802 that was first etched away, to ensure that the entire line has been etched to the endpoint. In other words, locations where scumming 802 was present require longer etch times to remove the scum 802 as well as the underlying film to be etched, in this case the oARC/SiON stack 520, 530. If the endpoint is triggered too early, the subject films 520, 530 would have only started to clear, resulting in portions of the subject films 520, 530 still to be etched. The etch processing going into a period of overetch allows the etching to continue, even to the point of allowing the etching process to begin etching into the underlying film layer, in this case the a:C film 540, to ensure that all of the material of the subject film layers 520, 530 has been adequately removed. Obviously, too little or too much overetching will have undesirable results.

Figure 9:
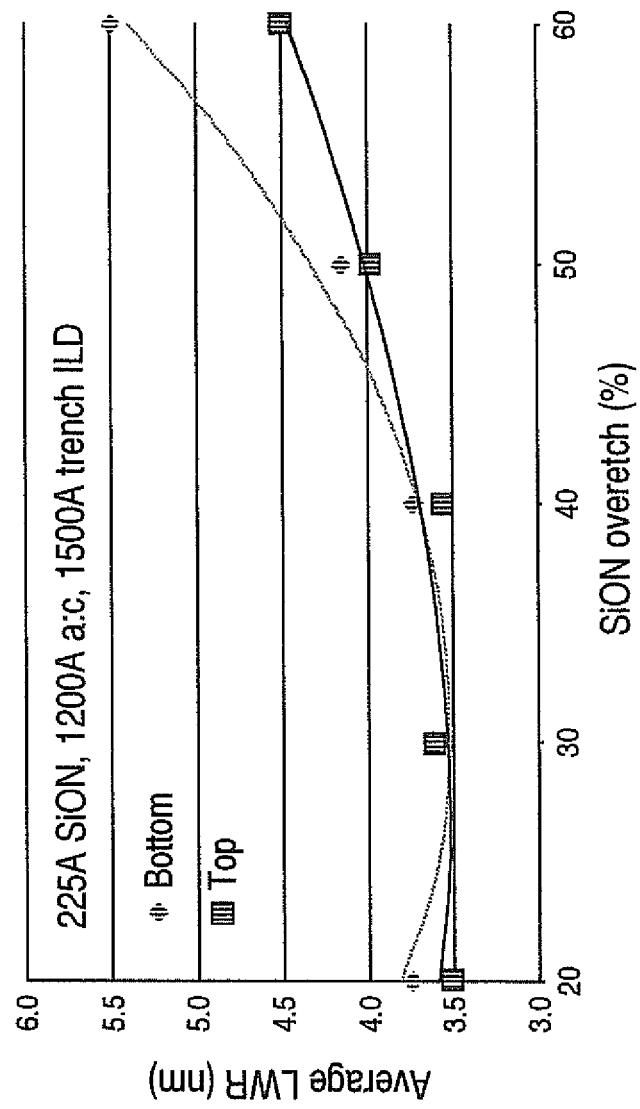
FIG. 9 is a graph illustrating SiON film overetch versus average line-width roughness in accordance with an embodiment of the present invention.

While a certain amount of overetching is necessary, overetching the SiON film 530 adversely affects average line-width roughness. To reduce the average line-width roughness, an optimum SiON overetch for a particular application is desired, a percentage that reduces overetch to the smallest amount possible, but no shorter. In other words, a sufficient amount of overetch is still required to adequately etch the desired material. As illustrated in FIG. 9, the industry standard or conventional overetch for the SiON film layer in the exemplary 43 nm NAND is fifty percent or more. While overetch of fifty percent would ensure that the etching process had completely cleaned out the SiON film layer 530, the resulting increase in top and bottom line-width roughness is undesirable. Overetch of forty percent provides a sufficient overetch and improves the line-width roughness over fifty percent, but still induces an undesirable amount of line-edge roughness. Further reducing overetch to percentages below forty percent, and to as low as thirty percent, has seen satisfactory etching results while continuing to reduce both the top and bottom average line-width roughness. Reducing overetch to an exemplary thirty percent reduces the average top and bottom line-width roughness to approximately 3.5, down from the average top and bottom line-width roughness of approximately 3.75 at forty percent. Other possible embodiments may use a SiON film overetch percentage of less than the conventional fifty percent, but greater than thirty percent. Other embodiments may use a SiON film overetch percentage of less than thirty percent.

The average line-width roughness may also be further improved by adjusting the RF power of the plasma etching while etching the SiON film layer 530. The semiconductor wafer is placed between two capacitively coupled electrodes. A bias power is applied to one electrode and a source power to the other electrode, each with different radio frequencies applied to the electrodes. High frequency power is responsible for generating the ion density necessary for the directional plasma etching process. The plasma density is made greater or smaller by varying the power applied to the electrodes.

Figure 10:
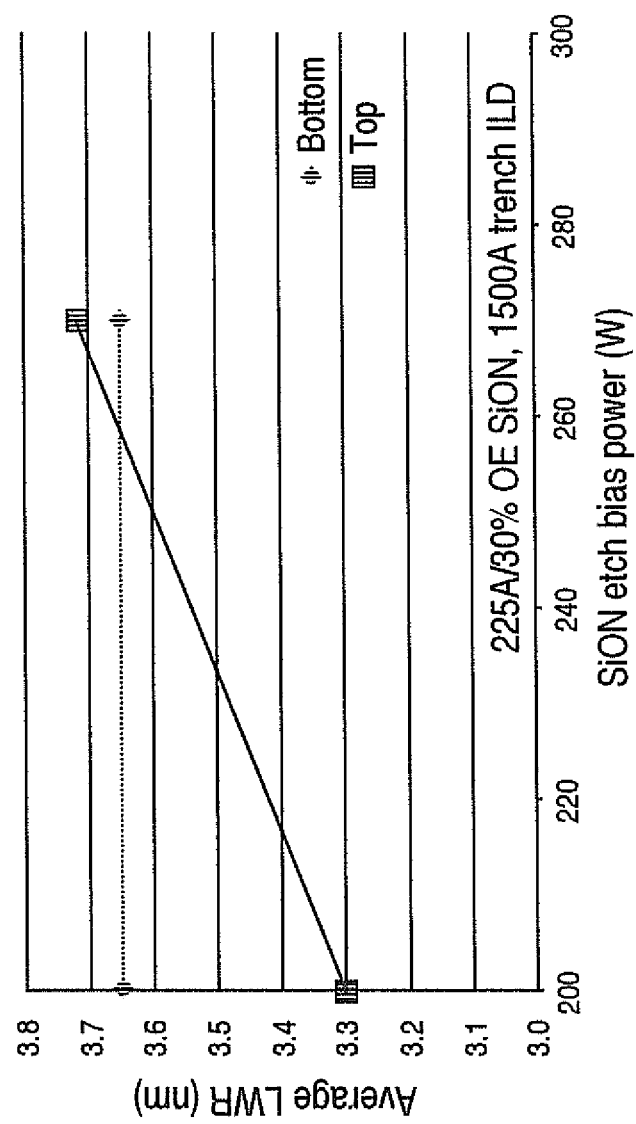
FIG. 10 is a graph illustrating SiON etch bias power versus average line-width roughness in accordance with an embodiment of the present invention.

While reducing the RF power during SiON film etching may reduce the average line-width roughness, there are limits. There are preferred power levels for successfully etching the SiON film when using the exemplary 30 percent overetch. Too little power and the average line-width roughness actually gets worse. As illustrated in FIG. 10, setting the SiON etch bias power to an exemplary 200 watts reduces the average line-edge roughness of the top of the line from approximately 3.7 at 270 watts to an average line-width roughness of only 3.3 at 200 watts. An almost 11% reduction in line-width roughness. While not illustrated in FIG. 10, a power level much below 200 watts requires extended etching times with the resulting increased risk of deformities introduced into the etching process, the deformities increasing the average line-width roughness. Other possible embodiments utilize other bias power ranges depending on the selected overetch. With overetch selected between the preferred thirty percentage and other values greater than thirty percent but less than the conventional fifty percentage overetch, an exemplary etch bias power may be some wattage more than the exemplary 200 watts, but less than the conventional wattage.

The average line-width roughness may be further improved by adding hydrogen to the plasma used for etching the SiON layer 530, changing the plasma from the traditional $CF_4/CHF_3/Ar$, to $CF_4/CHF_3/Ar/H_2$. The addition of $H_2$ to the plasma etch while etching the SiON layer 530 strengthens the remaining photoresist, further reducing the extent of deformities in the photoresist that could passed on to the underlying layers as increased line-edge roughness.

Removing the SiON Layer Immediately after Amorphous Carbon Etching

As seen in FIG. 11, after etching through the oARC film 520 and the SiON film 530, the photoresist film 510 has been reduced through exposure to the plasma etch. As the plasma etch continues to cut the vias 502, 504 into the SADD M1 dielectric film stack 500, the photoresist 510 will continue to wear away under the effects of the plasma etch. Obviously, the photoresist will not survive to complete the full etching process. Technological improvements have led to the use of pattern transfer layers, that as the name implies, transfer the pattern of the photoresist to a lower layer, allowing the etching to continue using the original pattern even after the photoresist is etched away. Pattern transfer layers use alternating organic and inorganic films. As FIG. 11 illustrates, after etching through the oARC film 520 and the SiON film 530, the photoresist 510 has been almost completely etched away. Indeed, by the end of the amorphous carbon (a:C) film 540 etching, only the SiON film 530 in FIG. 12's illustrative example remains. The remainder of any photoresist 510 and the oARC film 520 have been etched way.

To prevent the SiON film 530 from deteriorating to the point that it passes on to underlying pattern transfer layers and the remainder of the SADD M1 film stack 500 deformities which lead to increased line-edge roughness as the etching process continues, the SiON film 530 is removed after the plasma etch has passed through the a:C film 540. At this point, the plasma etch process is discontinued and a cleaning step is inserted into the etch progression. A CF4-based step cleanly removes the remaining SiON film 530. With the removal of the SiON film 530, any stress mismatch that would lead to additional line-edge roughness is relieved. In other words, the amorphous carbon film 540 is thick enough to serve as a proper etch pattern layer for the remainder of the etching process without the risk of additional line-edge roughness due to deterioration of the a:C film 540 while it is serving as a pattern layer. As illustrated in FIG. 13, after the removal of the remaining SiON film 530, the a:C film 540 serves as the pattern layer for the remainder of the arc or trench 502, 504 etching.

Figure 14:
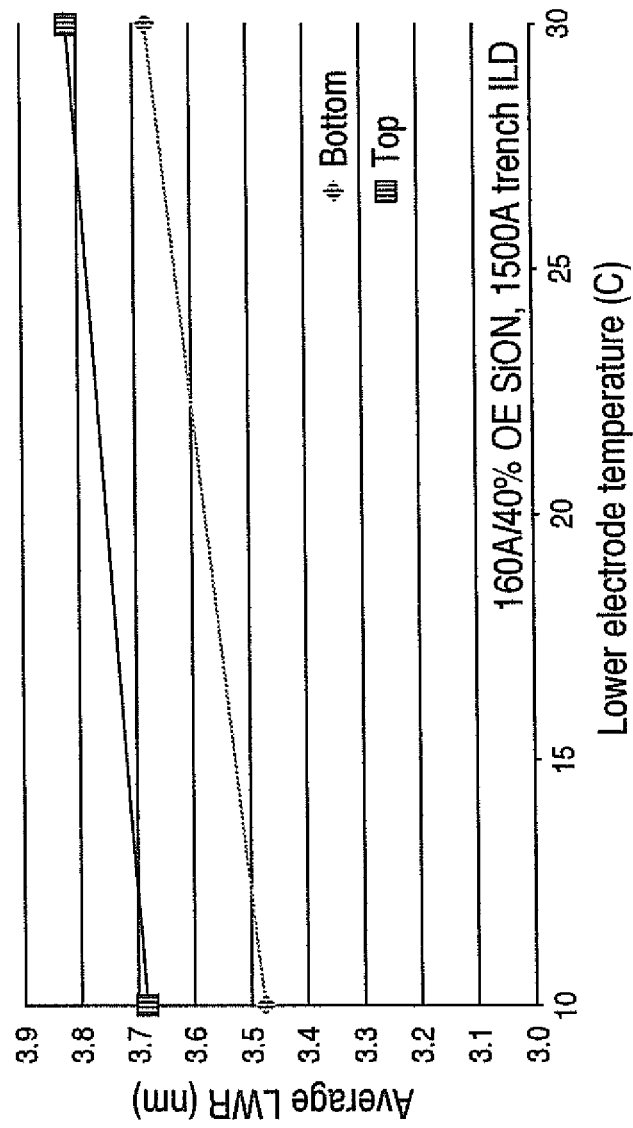
FIG. 14 is a graph illustrating lower electrode temperature versus average line-width roughness in accordance with an embodiment of the present invention.

Reducing Lower Electrode Temperature to Reduce Top and Bottom Line-Width Roughness The average line-width roughness for both the top and bottom of the line or structure may be reduced by lowering the lower electrode temperature. As the semiconductor wafer is clamped to the lower electrode, lowering the temperature of the lower electrode will improve the overall temperature of the wafer during plasma etching. The plasma process exposes the wafer to a lot of energy and resultantly heats up the wafer. A wafer clamped to a lower electrode temperature controlled to an industry standard or conventional temperature of 30 degrees C. will heat up under plasma etching to as much as 100 degrees C. or more. Further lowering the temperature of the lower electrode will reduce the temperature of the wafer during plasma etching. As illustrated in FIG. 14, reducing the lower electrode temperature from 30 degrees C. to as low as 10 degrees C. while etching the SiON film 530 improves both the top and bottom line-width roughness from approximately 3.8 and 3.7, respectively, to approximately 3.7 and 3.5, respectively. The optimum lower electrode temperature for line-width roughness has been identified as 10-15 degrees C. While not illustrated in FIG. 14, the improvement in average line-width roughness was more dramatic when the other parameters as discussed above were not optimized. In other words, dramatic improvements in line-edge roughness may be seen by lowering the lower electrode temperature to 10-15 degrees C. Further, while an overall reduction in temperature throughout the etching process may be desired, there are associated difficulties with maintaining the lower electrode at cooling temperatures of 10-15 degrees C. Therefore, as indicated in FIG. 14, the lower electrode may optionally be cooled only during the oARC/SiON films etching. Further, other embodiments may utilize different low electrode cooling temperatures within the ranges described above. For example, in another exemplary embodiment, the lower electrode temperature may be controlled to a temperature within the range of 10-25 degrees C. In the end, any reduction in lower electrode temperature below the conventional temperature resulted in improved line-edge roughness, especially when the other parameters were not optimized.

What is claimed is:

1. A method for fabricating a semiconductor device, the method comprising:
providing a semiconductor substrate with a plurality of mask layers formed on the semiconductor substrate, wherein the plurality of mask layers comprise: an organic antireflective coating/silicon oxynitride (oARC/SiON) film stack for mitigating line-edge roughness in the semiconductor device;
providing a patterned photoresist layer over the plurality of mask layers formed over the substrate, wherein the patterned photoresist layer is in contact with the oARC/SiON film stack; and
etching the plurality of mask layers formed on the substrate, using the patterned photoresist layer as an etching mask to form at least one trench in the plurality of mask layers, wherein the oARC/SiON film stack is etched with an overetch that is less than 30 percent, wherein the overetch of less than 30 percent prevents resulting increase in top and bottom line width roughness while cleaning out the SiON, and wherein a higher percentage of SiON overetch provides undesirable increase in to and bottom average line width roughness.

2. The method of claim 1, wherein the patterned photoresist comprises 193 nanometer (nm) photoresist, for immersion argon fluoride (ArF) ultra violet lithography, wherein the pattern is formed using about 193 nm wavelength radiation.

3. The method of claim 2, wherein the photoresist is approximately 1150 angstroms (Å) thick.

4. The method of claim 1, wherein the SiON film layer is approximately 225 angstroms (Å) thick.

5. The method of claim 1, wherein a bottom electrode in contact with the semiconductor device has a temperature of approximately 10-15 degrees C. during at least the oARC/SiON film etching.

6. The method of claim 5, wherein the bottom electrode temperature is approximately 10 degrees C.

7. The method of claim 1 further comprising providing an amorphous carbon film layer, wherein the SiON film layer is removed after a plasma etch has passed through the amorphous carbon film layer.

8. The method of claim 1, wherein a plasma for etching the SiON film layer comprises hydrogen.

9. The method of claim 1, wherein the etching of the plurality of mask layers form at least one of a group consisting of vias, trenches, and semiconductor devices.

10. A method for fabricating a semiconductor device, the method comprising:
providing a substrate with a plurality of mask layers formed on the substrate, wherein the plurality of mask layers comprise: an organic antireflective coating/silicon oxynitride (oARC/SiON) film stack for mitigating the edge roughness in the semiconductor device;
providing a patterned photoresist layer over the plurality of mask layers formed over the substrate, wherein the patterned photoresist layer is in contact with the oARC/SiON film stack; and
etching the plurality of mask layers formed on the substrate, using the patterned photoresist layer as an etching mask to form at least one trench in the plurality of mask layers, wherein the etch bias power for the oARC/SiON film stack etching is approximately 200 watts when the overetch is approximately 30 percent, wherein the overetch of less than 30 percent prevents resulting increase in top and bottom line width roughness while cleaning out the SiON, and wherein a higher percentage of SiON overetch provides undesirable increase in top and bottom average line width roughness.

11. The method of claim 10, wherein the SiON film layer thickness is approximately 225 angstroms (Å).

12. The method of claim 10, wherein the patterned photoresist comprises 193 nanometer (nm) photoresist, for immersion argon fluoride (ArF) ultra violet lithography, wherein the pattern is formed using about 193 nm wavelength radiation.

13. The method of claim 10, wherein the bottom electrode in contact with the semiconductor device has a temperature of approximately 10-15 degrees C. during at least the oARC/SiON film etching.

14. The method of claim 13, wherein the bottom electrode temperature is 10 degrees C.

15. The method of claim 10 further comprising providing an amorphous carbon film layer, wherein the SiON film layer is removed after a plasma etch has passed through the amorphous carbon film layer.

16. The method of claim 10, wherein the photoresist is approximately 1150 angstroms (Å) thick.

17. The method of claim 10, wherein a plasma for etching the SiON film layer comprises hydrogen.

18. The method of claim 10, wherein the etching of the plurality of mask layers forms at least one of a group consisting of vias, trenches, and semiconductor devices.

* * * * *